United States Patent
Knaipp

(10) Patent No.: US 7,663,203 B2
(45) Date of Patent: Feb. 16, 2010

(54) HIGH-VOLTAGE PMOS TRANSISTOR

(75) Inventor: Martin Knaipp, Unterpremstätten (AT)

(73) Assignee: Austriamicrosystems AG, Unterpremstatten (AT)

( * ) Notice: Subject to any disclaimer, the term of this patent is extended or adjusted under 35 U.S.C. 154(b) by 101 days.

(21) Appl. No.: 10/591,001

(22) PCT Filed: Feb. 28, 2005

(86) PCT No.: PCT/EP2005/002112

§ 371 (c)(1),
(2), (4) Date: Jun. 25, 2007

(87) PCT Pub. No.: WO2005/083794

PCT Pub. Date: Sep. 9, 2005

(65) Prior Publication Data

US 2007/0278573 A1     Dec. 6, 2007

(30) Foreign Application Priority Data

Feb. 27, 2004   (DE) ................ 10 2004 009 521

(51) Int. Cl.
*H01L 29/94*   (2006.01)
(52) U.S. Cl. ............... 257/492; 257/493; 257/E27.06
(58) Field of Classification Search ............... 257/492, 257/493, E27.06
See application file for complete search history.

(56) References Cited

U.S. PATENT DOCUMENTS

| 5,510,643 | A | * | 4/1996 | Kariyama ............. 257/409 |
| 5,512,495 | A | * | 4/1996 | Mei et al. ............. 438/286 |
| 5,981,997 | A | * | 11/1999 | Kitamura ............. 257/335 |
| 6,097,063 | A | * | 8/2000 | Fujihira ............. 257/339 |
| 6,448,625 | B1 | * | 9/2002 | Hossain et al. ............. 257/493 |

(Continued)

FOREIGN PATENT DOCUMENTS

EP     0 524 030 A     1/1993

(Continued)

OTHER PUBLICATIONS

R. Stengl et al., "Variation of Lateral Doping—A New Concept to Avoid High Voltage Breakdown of Planar Junctions", International Electron Devices Meetings, Washington, D.C. USA, pp. 154-157, Dec. 1, 1985.

(Continued)

*Primary Examiner*—Eugene Lee
(74) *Attorney, Agent, or Firm*—Cohen Pontani Lieberman & Pavane LLP

(57) ABSTRACT

In a high-voltage PMOS transistor having an insulated gate electrode (18), a p-conductive source (15) in an n-conductive well (11), a p-conductive drain (14) in a p-conductive well (12) which is arranged in the n-conductive well, and having a field oxide area (13) between the gate electrode and drain, the depth (A'-B') of the n-conductive well underneath the drain (14) is less than underneath the source (15), and the depth (A'-B') of the p-conductive well is greatest underneath the drain (14).

6 Claims, 3 Drawing Sheets

U.S. PATENT DOCUMENTS

| | | |
|---|---|---|
| 6,455,893 B1 | 9/2002 | Gehrmann et al. |
| 6,468,870 B1 * | 10/2002 | Kao et al. .................. 438/297 |
| 6,476,457 B2 * | 11/2002 | Oh ............................. 257/492 |
| 6,521,962 B2 * | 2/2003 | Evans ......................... 257/409 |
| 7,064,385 B2 * | 6/2006 | Dudek et al. ............... 257/335 |

FOREIGN PATENT DOCUMENTS

| | | |
|---|---|---|
| EP | 0 973 205 A | 1/2000 |
| EP | 1 498 956 A | 1/2005 |
| JP | 02-172220 | 7/1990 |
| JP | 05-172220 | 7/1990 |
| JP | 05-304169 | 11/1993 |
| WO | WO 97/13277 | 4/1997 |
| WO | WO 03/092078 A | 11/2003 |

OTHER PUBLICATIONS

C. Bassin et al., "High-Voltage Devices for 0.5-MUM Standard CMOS Technology", IEEE Electron Device Letters, vol. 21, No. 1, pp. 40-42, Jan. 2000.

K. Kinoshita et al., "A New Adaptive Resurf Concept for 20 V LDMOS without Breakdown Voltage Degradation at High Current", Proceedings of the $10^{th}$ International Symposium on Power Semiconductor Devices and ICS (ISPSD '98), Kyoto, Japan, pp. 65-68, Jun. 3, 1998.

* cited by examiner

HIGH-VOLTAGE PMOS TRANSISTOR

RELATED APPLICATIONS

This is a U.S. national stage of application No. PCT/EP2005/002112, filed on Feb. 28, 2005. This patent application claims the priority of German patent application no. 10 2004 009 521.3 filed Feb. 27, 2004, the disclosure content of which is hereby incorporated by reference.

FIELD OF THE INVENTION

The invention relates to a high-voltage PMOS transistor having an insulated gate electrode, a p-conductive source region in an n-conductive well and a p-conductive drain region in a p-conductive well which is arranged in the n well.

BACKGROUND OF TILE INVENTION

The manufacture of high-voltage transistors in integrated circuits, which is known per se, generally produces optimized transistors for the desired voltage range. This range can extend from more than 10 volts to 150 volts and beyond. A typical application is automobile engineering in which, in addition to its logic circuit elements, switches for the battery voltage levels and for coping with interference pulses (bursts) also have to be provided. These high-voltage transistors can basically be manufactured with processes such as are used for CMOS circuits with application ranges from 3.3 volts to 5 volts. However, this manufacture is costly and expensive because a multiplicity of additional masks and process steps are necessary and/or there is a resulting large space requirement for the high-voltage transistor.

Vertical high-voltage transistors are usually produced in an epitaxy layer whose thickness and concentration has to be optimized for the desired voltage range. The layer thicknesses can quickly be 10 μm or more, which can be implemented only by using complex epitaxy deposition. The necessary buried layer, its doping and formation of contacts with it through the epitaxy layer (sinker) require a number of process steps which are specifically necessary for the high-voltage transistor. In order to optimize the transistor area, i.e. its lateral extent, the thickness of the epitaxy layer has to be adapted to the desired voltage level.

The attempt to manufacture high-voltage transistors as lateral transistors in conjunction with a low-voltage process for logic transistors gives rise to other difficulties. For example, the electrical field strengths have to be allowed for in such a way that a breakdown, which can lead to malfunctions or to the destruction of the integrated circuit, does not occur at the points of maximum field strength concentration. As a rule, this requirement means that a large amount of space is required for the high-voltage transistors, and thus leads to high manufacturing costs.

EP 0 973 205 A2 describes a high-voltage MOS transistor with a drain extension in which the embedding n well has a lower depth underneath the drain extension than underneath the drain which is provided. The depth of the p-conductive well is greater in the area of the drain extension than underneath the drain which is provided. The points of least depth of the n well and greatest depth of the p well are offset with respect to one another.

Document R. Stengi and U. Gösele: "Variation of Lateral Doping—A New Concept to Avoid High Voltage Breakdown of Planar Junctions", International Electron Devices Meeting, Technical Digest, 1 to 4 December 1985, pages 154 to 157 (XP002013050) describes a masking in order to manufacture a p-conductive well in which additional covers are provided in certain sections between the central area and the edge area of the well which is to be produced.

U.S. Pat. No. 6,455,893 B1 discloses a lateral high-voltage transistor which requires a smaller amount of space because the electrical field strength occurring at the highly doped drain is reduced by means of a drain extension and a field plate with less strong doping. The described transistor can also be used for CMOS processes with less than 1 μm structure width. However, the document indicates that the dielectric strength of the transistor is restricted because the retrograde implantation profile in the edge areas of the drain extension leads to a less suitable doping pattern.

SUMMARY OF THE INVENTION

One object of the invention is to provide an improved lateral high-voltage PMOS transistor, a mask or masking for the corresponding wells. Another object of the invention is to provide a method for manufacturing the wells.

These and other objects are attained in accordance with one aspect of the present invention directed to a high voltage PMOS transistor comprising an insulated gate electrode, a p-conductive source region in an n-conductive well which is arranged on a p-conductive substrate, a p-conductive drain region in a p-conductive well which is arranged in said n-conductive well, and an insulation area between said gate electrode and said drain region, wherein the depth of the n-conductive well underneath said drain region is less than underneath said source region, and the depth of the p-conductive well is greatest underneath the drain region.

Another aspect of the present invention is directed to a mask for manufacturing an n-conductive well of a high-voltage PMOS transistor, in which the area of the drain which is provided is covered with a drain cover, and a further cover between the areas which are provided for the drain and the source is produced at a distance from the drain cover.

Another aspect of the present invention is directed to a masking for manufacturing a p-conductive well of a high-voltage PMOS transistor, in which additional covers are provided in certain sections between the central area and the edge area of the well which is to be produced, which widen in the direction from the source which is provided to the drain which is provided, and are spaced apart from one another.

Another aspect of the present invention is directed to a method for manufacturing an n-conductive well and a p-conductive well of a high-voltage PMOS transistor having a p-conductive drain region in the p-conductive well which is arranged in the n-conductive well, in which the implantation of ions is carried out by means of masks or maskings in such a way that the doping depth of the p-conductive well is greater under the drain which is provided than in the direction of the well areas which are assigned to the source.

A high-voltage PMOS transistor according to the invention has the advantage that it can be manufactured with a low-voltage process which is customary per se and is not provided per se for the desired high-voltage range, with only a small amount of additional expenditure. This ensures that the combination of high-voltage transistors and low-voltage transistors leads to improved high-voltage properties but the low-voltage properties of the corresponding transistors are not adversely affected. In particular, for this reason the high-voltage transistor according to the invention has the advantage that a higher operating voltage is permitted.

The invention has the further advantage that with the high voltage which is provided it is not possible for a breakdown to occur from the p well to the substrate.

Furthermore, the invention has the further advantage that the critical electrical field strength in the p well underneath the drain is reduced if the drain contact is biased with a highly negative voltage with respect to the source.

In one refinement of the invention there is the advantage that the electrical field strength at the surface of the structure is reduced, which is known as a RESURF effect (RESURF corresponds to "REduced SURface Field").

For this purpose, a field plate which is arranged on the field oxide is provided above the p well which serves as a drift path.

A further refinement of the invention provides for the electrical field strength to continue to be controlled using a metalization layer of the first metalization level which is electrically connected to the field plate on the field oxide using a via, and extends laterally over the field oxide in the direction of the drain.

The invention has the further advantage that the charge carrier concentration in the n well or the p well can be controlled in the critical area underneath the drain using the claimed mask or masking.

Finally, the invention has the advantage that it makes possible a method for manufacturing the n well areas or p well areas on the transistor head, i.e. at the edge areas underneath the drain which are optimized for the voltage provided.

BRIEF DESCRIPTION OF THE DRAWINGS

The invention will be explained below in more detail in the figures of the drawing using exemplary embodiments. The figures serve alone to illustrate the invention and are therefore only schematic and not to scale. Identical elements or identically acting elements are provided with identical reference symbols. In the drawing.

DETAILED DESCRIPTION OF THE DRAWINGS

Figure 4:
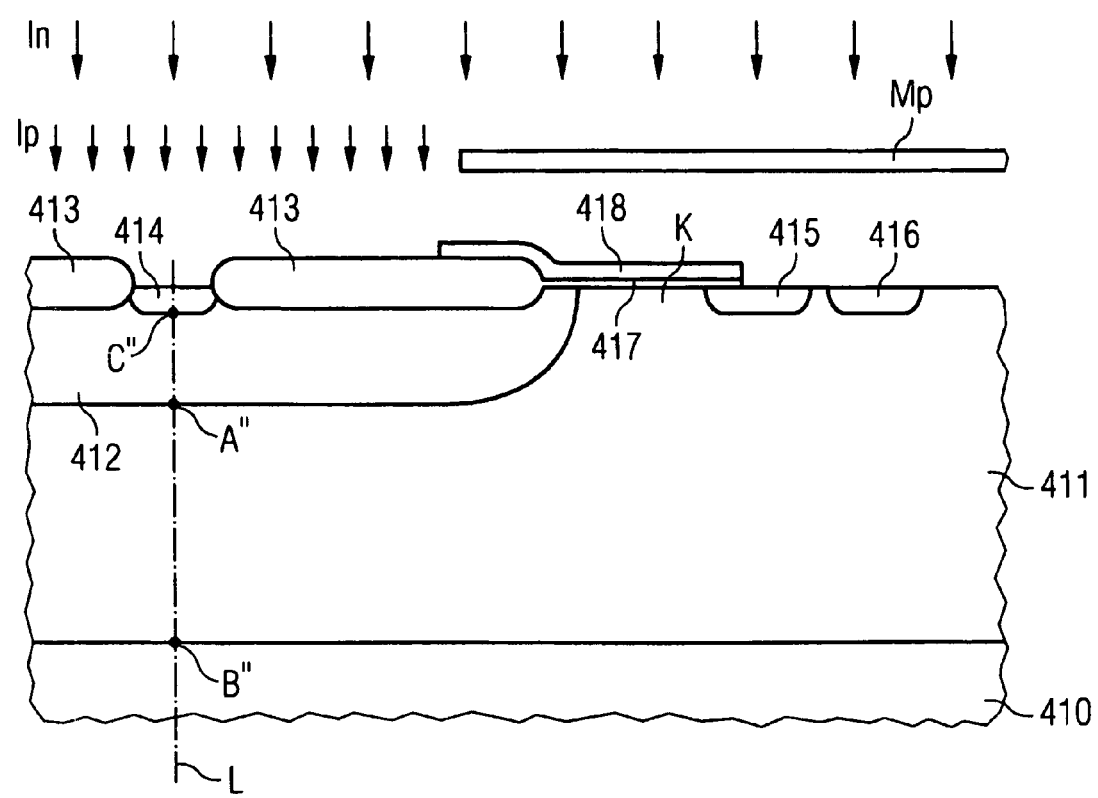
FIG. 4 shows a high-voltage PMOS transistor by analogy with the prior art.

The invention becomes more comprehensible in its entirety on the basis of FIG. 4 which is a development of the prior art mentioned at the beginning. According to FIG. 4, an n-doped well 411 is arranged on a substrate 410. A highly doped p-conductive area 415 as a source terminal is provided inside the n well 411. Next to it a highly doped n-conductive area 416 which can serve as a ground terminal (body) is arranged. The channel zone K is adjacent on the other side of the source region 415 and the gate electrode 418, made of polysilicon for example, is arranged above said channel zone K, insulated by means of a gate oxide 417.

Field oxide areas 413 which have a window for reception of the highly doped, p-conductive drain 414 are provided in the direction of the drain. Underneath the drain 414 and the field oxide areas 413, a p-doped well 412 is arranged within the n-doped well 411 which extends laterally into the channel zone K. The gate electrode 418 is lengthened in the direction of the drain 414 to cover an area of the field oxide 413. This area which lies above the p-doped well 412 serves as a field plate for controlling the electric field. The area of the p-doped well 412 between the drain 414 and the channel zone K serves as a drift area for the charge carriers, and in the lateral direction serves for reducing the electrical field.

In the exemplary embodiment, the high-voltage PMOS transistor is symmetrical with respect to the line L. In the vertical direction underneath the drain 414, points A", B" and C" are shown along the doped line L serving as a line of symmetry of the PMOS transistor. At the high potential which is present at the drain, the distance A"-B" must be dimensioned such that a punch through cannot occur between the p-doped well 412 and the substrate 410. At the same time, the distance A"-C" must be dimensioned such that the critical field strength occurring at the point A" is reduced if the drain contact 414 changes from a high voltage level to a low voltage level (substrate potential level).

Furthermore, FIG. 4 is a schematic illustration of the manufacture of the n well and of the p well during the manufacture of the transistor. In a first step, implantation with n ions is carried out over a large area in the substrate 410, no mask being provided for the implantation in the vicinity of the described transistor. This is indicated by the uniformly distributed arrows and the reference symbol In.

In a subsequent step, the p well 412 is then manufactured. To do this, the area of the n well 411, which is then intended to accommodate the channel and the source zone, is covered with a mask Mp. First, implantation Ip with p ions, for example boron ions, which is carried out by means of uniform arrows in the window of the mask Mp, produces an implantation region. In the subsequent thermal steps, for example when the field oxides are produced, the p ions diffuse out so that the p well 412 is produced. Compared to the document U.S. Pat. No. 6,455,893 which is referred to, the advantage is obtained that underneath the channel region and the field oxide a well structure is produced such as is illustrated in FIG. 4. A uniform doping profile and thus better field control is produced in the edge areas under these regions.

In the exemplary embodiment in FIG. 4, the p-n junction between the p-conductive substrate 410 and the n-doped well 411 is virtually flat. Likewise, the p-n junction between the p-doped well 412 and the n-doped well 411 underneath the drain 414 is very flat. The distance A"-C" is set by means of the diffusion step after the implantation. This distance is necessary since the spatial charge zone in the vicinity of the point A" must not extend as far as the p+ since the spatial charge zone in the vicinity of the point A" must not extend as far as the p+ diffusion region of the drain 414. At the same time, a predefined distance A"-B" is produced in order to prevent a punch through between the substrate and the p-doped well 412.

The channel K and a p-doped well 12 are firstly adjacent to the source region 15 in the direction of the highly doped, p-conductive drain region 14. The well 12 extends down underneath the drain diffusion 14 and laterally underneath the field oxide areas 13. In the exemplary embodiment, the edge areas of the p well 12 are made to extend under the gate electrode 18 which is insulated from the two wells 11 and 12 and source 15 by means of the gate oxide 17.

The gate electrode 18 is embodied, for example, as a polysilicon layer and extends from the source 15 toward and over the field oxide 13 in the direction of the drain 14. If this highly conductive, lengthened gate electrode is arranged above the well 12, it serves as a field plate for controlling the electric field in the edge area of the well 12. At a higher level, the metal 1 level in the exemplary embodiment, a metal layer 19 is provided above the polysilicon field plate, said metal layer 19 extending further in the direction of the drain 14 between the gate 18 and drain 14 above the field oxide 13. The metal layer 19 is electrically connected to the gate electrode 18 by means of a via 20.

Figure 1:
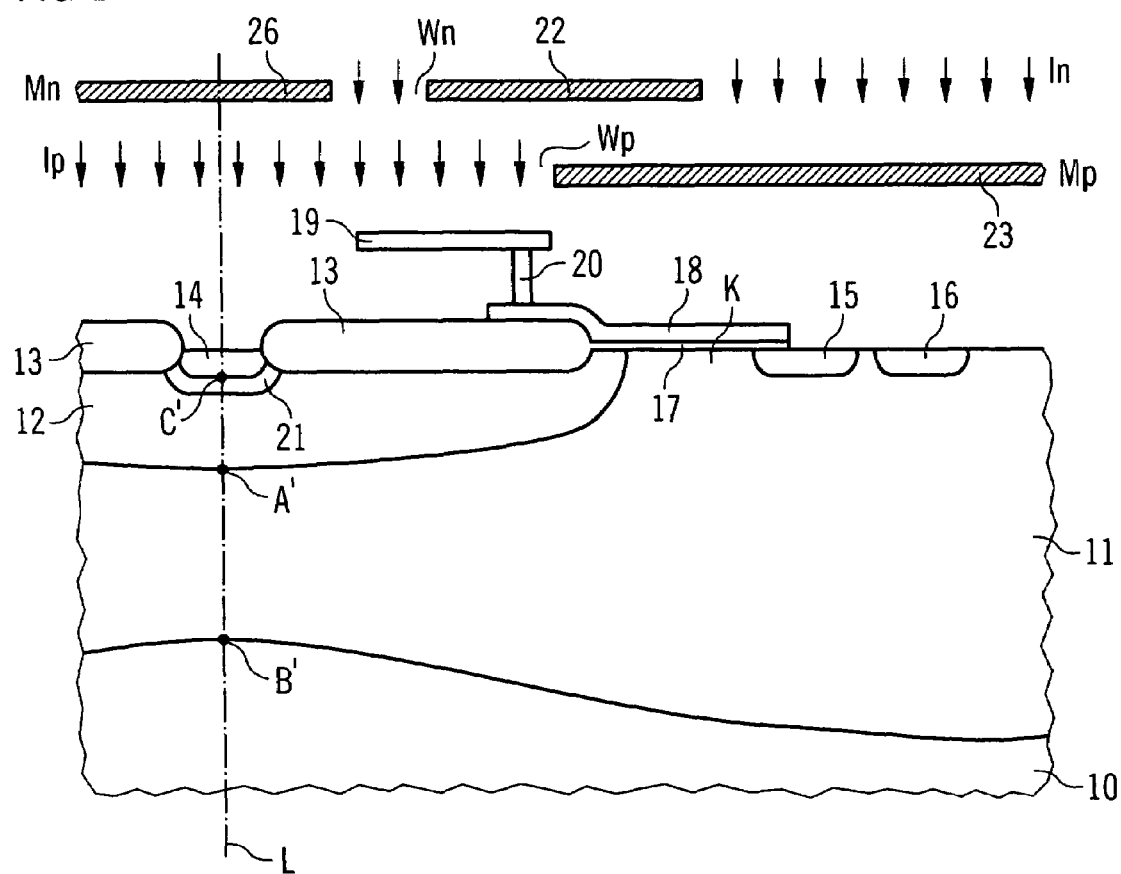
FIG. 1 is a schematic cross section through a high-voltage PMOS transistor according to the invention.

FIG. 1 describes well shapes which are improved further compared to FIG. 4. According to FIG. 1, an n doped well 11 is arranged in a substrate 10, said well 11 containing at its surface a highly doped p-conductive zone 15 as source or source terminal. In addition to this source region 15, a highly doped, n-conductive area 16, via which the ground connection (body) can be formed, is provided.

FIG. 1 illustrates a flat p-doped well 21 underneath the drain region, said well 21 being per se unnecessary but being advantageously produced in transistors for particularly high voltages. The flat p-doped well 21 is typically embodied as a retrograde well with boron and an energy of less than 150 kV as well as a concentration of approximately $10^{13}$ cm$^{-2}$. A short drive-in step is carried out. The p-doped well area 21 ends 0.5 μm under the silicon surface. This well brings about a concentration in its well region which is lower than the drain doping and higher than the doping with the p-doped well 12. The doping therefore decreases uniformly from the drain diffusion in the direction of the substrate, as a result of which excessive increases in the electrical field strength or a breakdown are avoided.

The invention now provides for the bottom of the p well 12 to extend deeper into the n well 11 underneath the drain terminal 14 than underneath the field oxide 13 and the gate electrode 18. At the same time, the well bottom of the n well 11 extends less deeply into the substrate 10 underneath the drain terminal 14 than in the other areas of the well.

The diffusing out of the p well 12 to different depths is controlled by the diffusing out of the n well 11. The n well 11 thus has a lower concentration in the area underneath the drain zone 14 than, for example, underneath the source zone. The concentration differences in the n well in the lateral direction permit the p well 12 to be able to diffuse out to differing degrees. To this extent, the diffusing out of the p well is controlled by means of the n well diffusion. For this reason, the p well extends deeper into the n well underneath the drain than in the vicinity of the channel because the n well 11 has higher counter-doping in the vicinity of the channel.

The shaping of the p well 12, which serves as a drift region for the charge carriers on the way to the drain 14, gives rise to a larger distance A'-C', i.e. in the depth underneath the drain, compared to a well with a flat bottom, thus preventing a premature breakdown. In the lateral direction towards the channel, the high field strength of the drain region 14 is reduced by the effect of the field plates composed of a lengthened gate electrode 18 and a metal layer 19. The metal layer 19 is associated here with the first metalization level which is used on a standard basis for an integrated circuit. Likewise, the via 20 between the metal layer 19 and the polysilicon electrode 18 is also manufactured with process steps which are known per se. The inclusion of the metal layer 19 in the field plate function makes it possible to cause the metal layer 19 to extend further from the gate electrode 18 in the direction of the drain 14 than would be allowed by the lengthened gate electrode 18 alone. The cause of this is the greater distance between the p well 12 and the metal layer 19 in this area. This results in a reduced surface field strength (RESURF-REduced SURface Field).

The reduced doping concentration in the drift region of the p well 12 is additionally controlled by the masking which is used for the p implantation and is described below with reference to FIG. 3.

It has become apparent that with a high-voltage PMOS transistor according to FIG. 1, on the one hand the dielectric strength is increased owing to the large distance between the points A' and C', and on the other hand the distance A'-B' is sufficiently large to prevent a punch through from the p-doped well 12 to the substrate 10.

The manufacture of the wells 11 and 12 with a corresponding mask or masking will be explained below.

The manufacture of the mask or masking is carried out with the materials and methods which are usually used in semiconductor technology. First, for a transistor structure according to FIG. 1, the n well 11 and then the p well 12 are produced on the semiconductor substrate before the field oxide areas 13 and the further highly doped areas for the source and gate or body are manufactured.

A mask Mn, which is outlined in a basic form above the transistor in FIG. 1, is manufactured on the undoped wafer as a first step. In the process, the mask is applied in such a way that areas 26 and 22 through which no implantation of ions is possible are produced. Then, an ion implantation In in which phosphorous ions are implanted with an energy of 300 kV and a dose of preferably 8.3×$10^{12}$ cm$^{-2}$ is carried out through the window Wn and the areas lying outside the mask part 22. Phosphorous ions which are more mobile than, for example, arsenic ions, are preferably implanted during the thermal diffusing-out process so that, with the exception of the shaded areas 26 and 22, a relatively uniform distribution of the doping of phosphorous is produced in the well 11.

Figure 2:
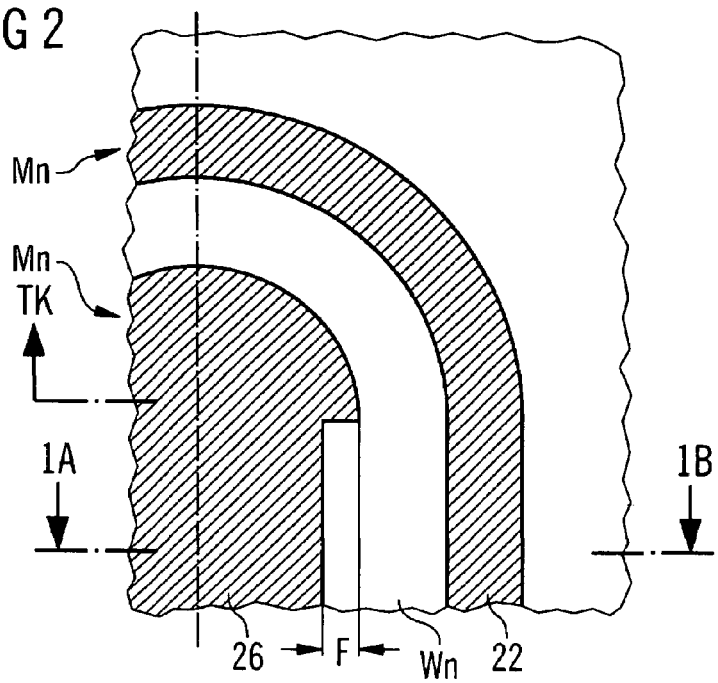
FIG. 2 is a detail from the mask for manufacturing the n well, in particular on the transistor head.

The mask which is used here is illustrated in the basic form with reference to FIG. 2. The masking 26 covers the central area of the drain. A further cover 22, which lies between the areas of the drain zone which is provided and the source diffusion which is provided, is provided at a distance from the drain cover 21. In the exemplary embodiment of FIG. 2, this further cover is embodied in a strip shape. The mask Mn which is outlined in FIG. 1 is illustrated as a cross section along the line 1A and 1B through the mask in FIG. 2.

The outer area of the transistor, which is characterized as a transistor head TK in FIG. 2, and lies perpendicularly to the plane of the drawing FIG. 1, is configured here in such a way that the drain cover 21 is first widened by twice the distance F and the drain cover then ends in a semicircular shape towards the transistor head. In a corresponding way, the area 22 between the drain and source which is applied in the form of a strip is also applied as a circular section at a distance from the drain cover. Of course, there is no need for a circular shape of the drain cover and of the further cover 22 in the area of the transistor head. Polygonal sections which extend linearly in certain sections could equally well be placed one against the other in order to form the mask termination of the transistor head.

Subsequent to the n well 11, the p well 12 is also implanted with a masking Mp. FIG. 1 also shows the section at the point 1A-1B. Outside the area of the p well which is provided, a masking 23 is provided over the entire surface. A window Wp in which cover areas 24 which lie one next to the other, come to a tip conically in the direction of the drain zone and are spaced apart from one another is first produced in the vicinity of the p well which is provided. The narrow side of the conical cover starts at a distance from the partial masking 23 and then extends in a conically increasing fashion in the direction of the provided drain region or the central area Z of the transistor. Areas through which implantation can be carried out remain exposed between the conical covers. The central area Z of the p well which is provided remains free of covering.

Figure 3:
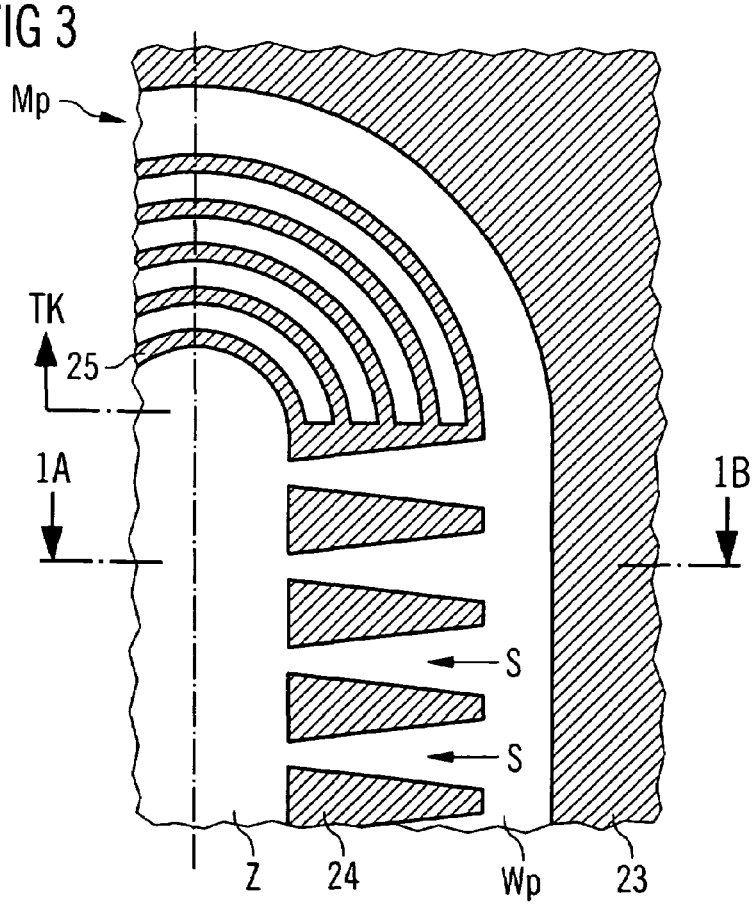
FIG. 3 is a detail of the masking for manufacturing the p well.

The mask according to FIG. 3 reduces the effect of implantation area by means of the areas 24 and 25, by using these conical or cylindrical masking strips so that the dose of the p implantation becomes smaller in the region of the drain zone.

This is necessary since lower doping of the n well and thus lower counter-doping of the n well is present in the vicinity of the drain zone.

A plurality of cover strips 25 which extend in an arc shape at a distance from one another and which extend virtually in parallel in the exemplary embodiment in FIG. 3 are arranged in the area of the transistor head TK at the end-side area of the transistor.

Implantation Ip with p ions, for example boron ions, is subsequently carried out through the exposed areas Wp which are not covered by the masking. This implantation is carried out in two steps, once with, for example, an energy of 300 kV and a dose of $5\times10^{12}$ cm$^{-2}$, and in the second step with an energy of, for example, 150 kV and also a dose of $5\times10^{12}$ cm$^{-2}$. Of course, both the energy and the dose can be changed depending on the type of manufacturing process used. The stated doses relate here to a process using technology with a structure width of 0.35 µm.

With the implantation with, for example, boron, the effective p doping is lowest near to the drain region since the conical mask sections 24 are almost in contact and as a result few p ions penetrate the silicon in this area. However, the net doping is decisive for the potential distribution. Since the n well also has lower doping in the drain region, the decrease in the p doping is compensated by the masking sections 24. The p well is deepest directly under the drain contact. The p-n junction migrates from there to the surface in the direction of the source.

The masking of FIG. 3 for the p well 12 causes a largely homogeneous drop in potential to form in the area between the source and the drain. Here, a drift doping channel which takes different forms and in which the flow of current from the source to the drain follows the direction of the indicated arrows S is produced between the source and the drain.

Subsequent to the implantations for the n well and p well, temperature steps are carried out which ensure that the dopant atoms are distributed within the respective well in such a way that they bring about the desired function. This can be done by means of special diffusion steps and in conjunction, for example, with the manufacture of the field oxide areas 13. Overall, the masking steps and the implantation of the p well 12 cause the electrical field to be set both in the vertical and lateral directions in such a way that there is no excess increase in the field strength, which could lead to a breakdown. As a result, high-voltage PMOS transistors of the type according to the invention, which can be operated with operating voltages of 50 volts and above can be produced in a low-voltage process which is conceived per se for voltages up to 5 volts.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A high-voltage PMOS transistor comprising:
    an insulated gate electrode;
    a p-conductive source region in an n-conductive well which is arranged on a p-conductive substrate;
    a p-conductive drain region in a p-conductive well which is arranged in said n-conductive well, said drain region having a portion facing away from said n-conductive well and forming part of a plane corresponding to an upper surface of the transistor; and
    an insulation area between said gate electrode and said drain region;
    wherein a lower boundary of the n-conductive well extends a shorter distance into the p-conductive substrate away from the upper surface underneath said drain region than the lower boundary of the n-conductive well extends into the p-conductive substrate away from the upper surface underneath said source region, and a lower boundary of the p-conductive well extends a farther distance into the n-conductive well away from the upper surface underneath said drain region than the lower boundary of the p-conductive well extends into the n-conductive well away from the upper surface underneath a region lateral to said drain region.

2. The high-voltage PMOS transistor as claimed in claim 1, wherein the p-conductive well extends laterally from the drain to the gate electrode.

3. The high-voltage PMOS transistor as claimed in claim 1, wherein the gate electrode extends above an insulating layer from the source region as far as a field oxide in the direction of the drain so that it covers the edge areas of the p-conductive well.

4. The high-voltage PMOS transistor as claimed in claim 1, wherein a field plate including a metal layer extends at a predefined distance above a field oxide and is connected to the gate electrode by means of a via, and in that the metal layer extends over the field oxide from the gate electrode in the direction of the drain.

5. The high-voltage PMOS transistor as claimed in claim 1, wherein the p-conductive well is more highly doped in the vicinity of the drain than in the external area towards the transistor channel (K).

6. The high-voltage PMOS transistor as claimed in claim 1, wherein the n-conductive well has lower doping underneath the drain than in the area underneath the transistor channel.

* * * * *